United States Patent [19]
Almaula et al.

[11] 3,967,001
[45] June 29, 1976

[54] PROCESS OF PREPARING A SECONDARY ELECTRON EMISSIVE COATING ON THE INTERIOR WALLS OF A MICROCHANNEL PLATE

[75] Inventors: Bipin C. Almaula, Alexandria, Va.; Philip G. Reif, Chatsworth, Calif.

[73] Assignee: The United States of America as represented by the Secretary of the Army, Washington, D.C.

[22] Filed: Sept. 20, 1974

[21] Appl. No.: 507,838

Related U.S. Application Data

[62] Division of Ser. No. 411,884, Nov. 1, 1973, abandoned.

[52] U.S. Cl. .................................. 427/78; 427/97; 427/237; 427/252; 427/255; 427/91; 427/124
[51] Int. Cl.² ........................................... B05D 5/12
[58] Field of Search ............... 427/97, 78, 237, 252, 427/255, 91, 124

[56] References Cited
UNITED STATES PATENTS

| | | |
|---|---|---|
| 3,160,517 | 12/1964 | Jenkin.................................. 427/252 |
| 3,798,060 | 3/1974 | Reed et al.............................. 427/97 |

*Primary Examiner*—Cameron K. Weiffenbach
*Attorney, Agent, or Firm*—Nathan Edelberg; Max L. Harwell; Robert P. Gibson

[57] ABSTRACT

A process of preparing a nickel secondary electron emissive conductive coating along the interior channel walls of a microchannel plate or by continuing the process of preparing a solid nickel conductor channel to provide a conductive panel and the apparatuses resulting therefrom. The microchannel plate is positioned in a heated oven, or deposition chamber, such that heated inert gases are forced through the open channels to stabilize the channel temperature. The temperature is then lowered and a nickel compound gas is mixed with the inert gas. The gas mixture is forced through the channels to decompose the microchannel plate material and deposit a thin nickel coating on the interior channel walls. If a conductive panel is desired, the process is continued until the entire channel is completely filled with nickel.

8 Claims, 4 Drawing Figures

PROCESS OF PREPARING A SECONDARY ELECTRON EMISSIVE COATING ON THE INTERIOR WALLS OF A MICROCHANNEL PLATE

The invention described herein may be manufactured, used and licensed by or for the Government for governmental purposes without the payment to us for royalty thereon.

This is a division, of application Ser. No. 411,884, filed Nov. 1, 1973, now abandoned.

BACKGROUND AND SUMMARY OF THE INVENTION

Even though microchannel plates have been produced having a metallic coating deposited partially within each open end of the channels, there has been little success in depositing a secondary electron emissive metallic layer along the entire length of the interior walls of the channels. Generally, any partially secondary electron emissive layer, semiinsulating layer, etc., is formed on the interior walls of the channels by virtue of being built into the entire layer of the microchannel plate.

The present inventive process and apparatuses resulting therefrom pertains to a method of depositing either a thin film of nickel on the interior channel walls, or by prolonged deposition forming a solid layer of nickel to form a conductive panel. The process comprises securing a microchannel plate wafer in a heated deposition chamber and passing a mixture of inert gas and nickel compound gas through the channels to decompose the microchannel plate material and deposit a thin nickel layer on the inside walls of the channels, or by continuing the process over a larger period of time filling in the channels almost entirely to produce a conductive panel having a multiple of solid conductors. The temperature of the deposition chamber is thermostatically controlled and, after the inert gas is passed through the channels for about 40 minutes at 270° Centigrade, the nickel compound gas is mixed with the inert gas and the gas mixture is passed therethrough at a lower temperature. A nickel compound, such as nickel carbonyl but not limited to this particular nickel compound, is heated in the nickel compound chamber and is valve released into the insulated piping between the inert gas chamber and the deposition chamber such that the mixture of inert gas and nickel carbonyl gas are thermostatically maintained at a temperature that is lower than the originally established 270° Centigrade. The heated nickel carbonyl gas is passed through the channels in various runs at different times and temperatures. Generally, the 270° Centigrade inert gas is passed through the wafer for about forty minutes and then the temperature of the heat element is lowered and the nickel carbonyl gas is passed through the wafer at a temperature of 150° to 200° Centigrade for times varying from 2 to 10 minutes.

Upon passing through the heated deposition chamber, the nickel carbonyl gas decomposes depositing nickel on the interior walls of the channels. After the wafer is removed from the deposition chamber the nickel coating on the walls of the channels may be further treated to enhance secondary electron emission by oxidizing the nickel surface or by forming metallic halides on the nickel surface.

DETAILED DESCRIPTION OF THE PREFERRED EMBODIMENT

Figure 1:
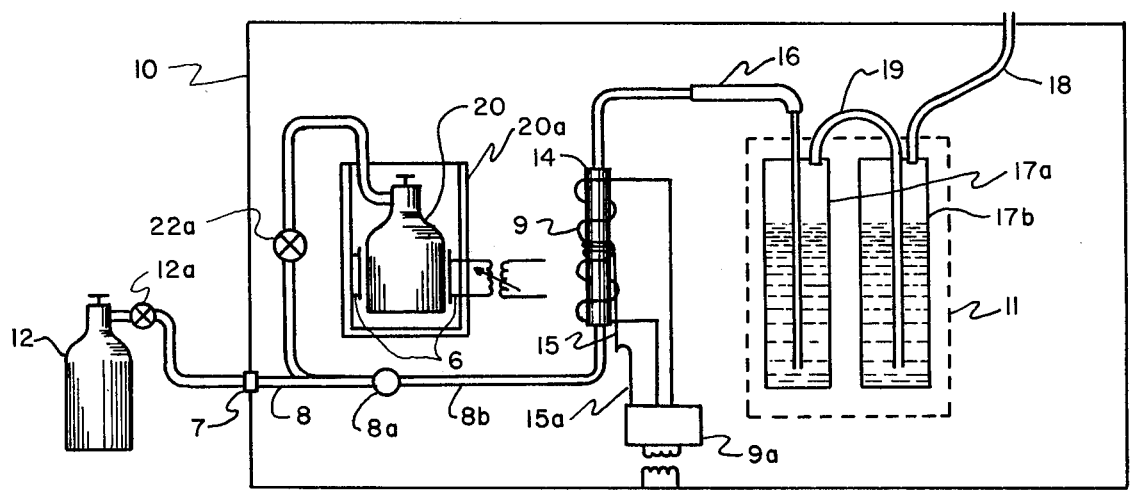
FIG. 1 is a schematic view of an apparatus that may be used in the practice of the inventive process.
Figure 2:
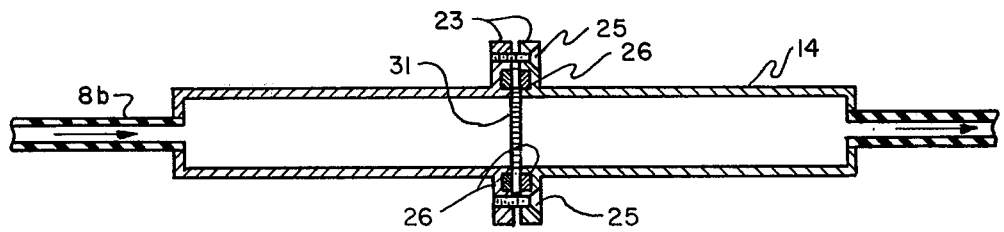
FIG. 2 illustrates a sectional view of the deposition chamber used in the practice of the inventive process.

Refer to both FIGS. 1 and 2 for an explanation of the inventive process and the arrangement of the elements that may be used in the practice of the inventive process to produce a novel microchannel plate or conductive panel. A microchannel plate wafer 31, made of some dielectric or semiconductor material such as glass or ceramic, is attached inside a cylindrical deposition chamber 14. Deposition chamber 14 is comprised of two ends that are flanged together by flanges 23, which flanges are secured together by a plurality of flange screws 25 (only two of which are shown in FIG. 2) such that wafer 31 is fitted against a round copper washer 26 surrounding the flanges. The screws tighten the flanges down on washer 26 and microchannel plate 31 such that chamber 14 is air tight to the toxic nickel compound gases passing therethrough. Chamber 14 is separated in two sections for convenience of transferring different microchannel plates 31 in and out of the chamber.

All of the elements used in the practice of the inventive process, except the inert gas container 12, are enclosed within deposition housing 10. The deposition housing is generally air tight and may preferably be made of heat resistant glass or a thin metal having insulation on the inside thereof. The inert gas in container 12 is under a pressure of perhaps 1,000 pounds by control valve 12a. The inert gas is valve released through piping 8, 8b, and chamber 14 at a pressure slightly above atmospheric pressure. A grommet 7 forms an air tight connection at housing 10 where insulated piping 8 passes therethrough. Piping 8 serves as a passageway for inert gas from container 12 to enter into mixture chamber 8a, whose function is explained later.

A nickel compound container 20, enclosed in insulated housing 20a, contains a nickel compound, such as nickel carbonyl, that may be in the liquid state and heated to the necessary temperature for conversion into a gaseous state by space heater elements 6 surrounding container 20. The nickel compound gas in container 20 is valve controlled by valve 22a and is mixed with the inert gas in mixture chamber 8a for the appropriate amount of time, which time is explained in detail later in this disclosure. Insulated piping 8b serves as a passageway for the gas mixture emerging from mixture chamber 8a and going into deposition chamber 14.

Deposition chamber 14 has a heater coil 9 wound around its outer surface. Heater coil 9 is also wound around a thermostat 15, which is in contact with the outer wall of chamber 14 if the chamber is made of a conductive material. The thermostat determines by a differential temperature means what the temperature is on the inside of chamber 14. Alternatively, the walls portion of chamber 14 may be made of some insulative material and the thermostat element inserted inside the chamber for a direct measurement of the internal chamber temperature. Heater coil 9 serves to heat the microchannel plate 31 and the internal portion of deposition chamber to the desired 270° Centigrade while the inert gas is passed threthrough. After the temperature of the inside of Chamber 14 is sensed by thermostat 15, the thermostat controls a temperature regulator 9a that is in line between the heater coil 9 and a power source. The power source may be an ordinary 110 volt alternating current outlet. Temperature regulator 9a may be an "on-off" type switching device in which the thermostat controls the on and off time of heater coil 9 or may have some differential means for slowly changing the temperature of coil 9. The microchannel plate 31 and interior of deposition chamber 14 are kept at 270° Centigrade temperature for about 40 minutes with valve 12a opened, allowing the argon gas to pass through piping 8, 8a, 8b, and chamber 14. The inert argon gas passes through the channels of the microchannel plate and on out through absorption tank 11 to the atmosphere by way of exhaust pipe 18. Absorption tank 11 comprises two absorption material containers 17a and 17b that, in the preferred embodiment of the present method, contain nitric acid (HNO$_3$) that reacts with the nickel compound gases and will be explained herein below. However, during the time that the argon gas only is being passed through absorption tank 11 there is no reaction with the nitric acid.

Flexible insulated tubing 16 is connected between deposition chamber 14 and the first absorption material container 17a. A crossover tube 19 guides the gases from the first absorption material container 17a to a second absorption material container 17b. Exhaust piping 18 then exhausts the gases from housing 10 into the atmosphere.

After the inert gas has been passed through the channels of microchannel plate 31 in chamber 14 at a temperature of 270° Centigrade, the nickel carbonyl gas in container 20 is then ready for release by opening valve 22a. However, the thermostat control is reset at a lower temperature, of about 150° to 200° Centigrade, with the argon gas still passing through the channels to remove the heat therefrom before valve 22a is opened. Once the channels and the interior of chamber 14 are stabilized at the lower temperature, valve 22a is open and the nickel carbonyl gas is mixed with the inert gas in mixture chamber 8a. The mixed gases are then passed on through chamber 14 and absorption tank 11. Nickel is removed from the gas mixture as the microchannel plate channel walls decompose and a thin nickel coating is applied to the channel walls and all exposed surfaces. With the removal of nickel from the gas mixture an excess of toxic carbonyl gases are present at the exit end of chamber 14. Therefore, these unreacted toxic carbonyl gases are removed by reacting with the nitric acid in containers 17a and 17b. These toxic gases are first forced into the lower portion of container 17a and after reacting with the nitric acid therein is forced into the lower section of container 17b for additional reacting to remove the toxic gases therefrom. The harmless gas is then exhausted to the atmosphere.

Six tests were run using this same arrangement of elements. The time of each of the tests and the temperature of the channel walls of the microchannel plate during each of these tests are shown in Table 1. Also, resistance measurements of the thin nickel coatings were made after each test. These resistance measurements are shown in Table 1. After each test, the microchannel plate was not removed until the temperature of the deposition chamber 14 was lowered to 50° Centigrade by closing valve 22a, thus discontinuing circulation of the nickel compound gas through chamber 14, and by removing the power from heater coil 9 while continuing to pass the ambient temperature inert gas through the channels.

TABLE I

| RUN NO. | TIME OF RUN | TEMPERATURE OF DEPOSITION CHAMBER (° CENTIGRADE) | MEASURED RESISTANCE OF NICKEL FILM (in megohms) |
|---|---|---|---|
|  | 2 | 150 | 1.75 |
| 2 | 5 | 150 | 3.10 |
| 3 | 10 | 150 | 100.00 |
| 4 | 2 | 200 | 4.00 |
| 5 | 5 | 200 | 2.00 |
| 6 | 10 | 200 | 50.00 |

Figure 3:
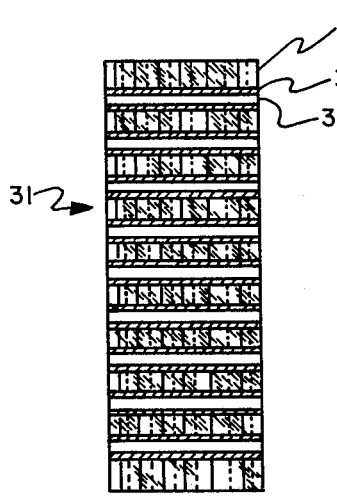
FIG. 3 shows a sectional view of a microchannel plate having a thin nickel conductive coating deposited on the interior channel walls.

FIG. 3 shows a partial sectional view of a microchannel plate 31 with a thin coating of nickel 35 deposited along the interior walls of the channels 37 according to the present inventive process. Microchannel plate 31 material is represented as glass in FIGS. 3 and 4 but may be ceramic.

Figure 4:
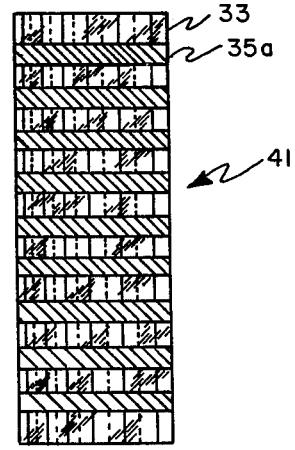
FIG. 4 illustrates a sectional view of a conductive panel produced by the inventive method.

FIG. 4 illustrates a conductive panel 41 produced by the inventive process. Conductive panel 41 is produced from the original microchannel plate 31 by continued operation to fill the originals 37 completely with a solid nickel conductor 35a to form a plurality of evenly spaced conductor rods.

Even though the preferred process explained herein above used nickel carbonyl gas as the decomposing element, other nickel compound gases may be used such as nickel acetate, nickelous chloride, nickel carbonate. Also, inert gases may be used other than argon, for example, nitrogen gas.

It should be understood, of course, that the foregoing disclosure relates to only a preferred embodiment of the invention and that numerous modifications or alterations may be made therein without departing from the spirit and scope of the invention as set forth in the appended claims.

We claim:

1. A process of preparing a secondary electron emission surface along the interior walls of a plurality of channels in a microchannel plate, the sequence of steps comprising:

providing a source of inert gas;
providing a source of nickel compound gas;
securing said microchannel plate in a deposition chamber with the outer rim of said microchannel plate sealed air tight against the interior walls of said deposition chamber for forcing said inert gas and said nickel compound gas to flow only through said plurality of channels;

simultaneously passing only said inert gas through said plurality of channels while heating the inside volume of said deposition chamber such that the heated inert gas is forced through the open channels of said microchannel plate to heat said microchannel plate to a temperature much higher than enough to decompose said nickel compound gas and continuing to pass said inert gas through the heated deposition chamber and said plurality of channels for an extensive time to stabilize the temperature of said microchannel plate;

lowering the temperature of said deposition chamber and said inert gas passing through said plurality of channels wherein the temperature of the interior walls of said plurality of channels is sufficient to decompose said nickel compound gas;

after the step of lowering the temperature, mixing said nickel compound gas and said inert gas in a mixture chamber prior to passing the resulting gas mixture through said plurality of channels at said lower temperature for sufficient time to decompose a nickel layer on the interior walls of said plurality of channels; and providing an absorption tank having a nitric acid solution therein at the output of said deposition chamber to neutralize the unreacted nickel compound gas passed through said absorption tank and exhausting the resulting harmless gases to the atmosphere.

2. A process as set forth in claim 1 wherein said inert gas is argon.

3. A process as set forth in claim 2 wherein the temperature in the step of heating said deposition chamber and microchannel plate to a temperature much higher than enough to decompose said nickel compound gas is 270° Centigrade and wherein said extensive time is for 40 minutes.

4. A process as set forth in claim 3 wherein the resulting temperature in said step of lowering the temperature of said deposition chamber and said inert gas is 150° Centigrade.

5. A process as set forth in claim 4 wherein said 150° Centigrade temperature is maintained and said gas mixture is passed through said plurality of channels for 2 to 10 minutes.

6. A process as set forth in claim 3 wherein the resulting temperature in said step of lowering the temperature of said deposition chamber and said inert gas is 200° Centigrade.

7. A process as set forth in claim 6 wherein said 200° Centigrade temperature is maintained and said gas mixture is passed through said plurality of channels for 2 to 10 minutes.

8. A process as set forth in claim 6 wherein said 200° Centigrade temperature is maintained and said gas mixture is passed through said plurality of channels for about one hour to completely fill said plurality of channels with nickel.

* * * * *